US012694432B2

(12) United States Patent
Fields et al.

(10) Patent No.: US 12,694,432 B2
(45) Date of Patent: Jul. 28, 2026

(54) LARGE LANGUAGE MODELING SYSTEMS AND METHODS FOR BUILDING, TESTING, AND VALIDATING A PREDICTIVE MODEL

(71) Applicant: State Farm Mutual Automobile Insurance Company, Bloomington, IL (US)

(72) Inventors: Michael W. Fields, Bloomington, IL (US); Stephen Prevatt, Bloomington, IL (US); Jeff Stoiber, Bloomington, IL (US)

(73) Assignee: State Farm Mutual Automobile Insurance Company, Bloomington, IL (US)

( * ) Notice: Subject to any disclaimer, the term of this patent is extended or adjusted under 35 U.S.C. 154(b) by 0 days.

(21) Appl. No.: 18/666,490

(22) Filed: May 16, 2024

(65) Prior Publication Data

US 2025/0265624 A1 Aug. 21, 2025

Related U.S. Application Data

(60) Provisional application No. 63/641,773, filed on May 2, 2024, provisional application No. 63/556,253, filed on Feb. 21, 2024.

(51) Int. Cl.
*G06Q 30/0283* (2023.01)
*G06F 30/20* (2020.01)

(52) U.S. Cl.
CPC ......... *G06Q 30/0283* (2013.01); *G06F 30/20* (2020.01)

(58) Field of Classification Search
CPC ............................ G06Q 30/0283; G06F 30/20
See application file for complete search history.

(56) References Cited

U.S. PATENT DOCUMENTS

| | | | |
|---|---|---|---|
| 10,115,120 B2 | 10/2018 | Chen et al. | |
| 10,963,799 B1 | 3/2021 | Aravala et al. | |
| 11,847,664 B2 | 12/2023 | Hauser | |
| 11,966,934 B2 | 4/2024 | Da Matta Navarro et al. | |
| 2022/0283784 A1* | 9/2022 | Degen ...................... | G06F 8/20 |

(Continued)

OTHER PUBLICATIONS

Ji Hoon Yoon, Dynamic Demand Response Controller Based on Real-Time Retail Price for Residential Buildings, 2014, p. 121-123 (Year: 2014).*

*Primary Examiner* — Ibrahim N El-Bathy

(74) *Attorney, Agent, or Firm* — Armstrong Teasdale LLP

(57) ABSTRACT

A computer system for building, simulating, and/or validating a predictive model. The computer system programmed to (i) analyze one or more predictive pricing sub-models to detect one or more issues; (ii) execute a GPT model on the one or more predictive pricing sub-models, the GPT model trained to identify differences between predicted pricing and actual pricing for certain predefined events; (iii) compare the one or more issues to one or more outputs of the GPT model; (iv) in response to the comparison, generate a new model software template including one or more code changes to the one or more predictive pricing sub-models based upon the comparison; (v) generate a simulation environment based upon a plurality of data; (vi) execute the new model software template in the simulation environment; and/or (vii) update the new model software template based upon one or more outputs of the execution.

21 Claims, 6 Drawing Sheets

(56)     References Cited

U.S. PATENT DOCUMENTS

| | | | |
|---|---|---|---|
| 2023/0237545 A1* | 7/2023 | Dougherty | G06Q 10/0875 |
| | | | 705/7.23 |
| 2024/0005353 A1* | 1/2024 | Kim | G06Q 30/0235 |
| 2024/0144372 A1 | 5/2024 | Wu et al. | |
| 2024/0144373 A1 | 5/2024 | Wu et al. | |

* cited by examiner

LARGE LANGUAGE MODELING SYSTEMS AND METHODS FOR BUILDING, TESTING, AND VALIDATING A PREDICTIVE MODEL

CROSS-REFERENCE TO RELATED APPLICATIONS

This application claims priority to U.S. Provisional Patent Application No. 63/556,253, filed Feb. 21, 2024, and U.S. Provisional Patent Application No. 63/641,773, filed May 2, 2024, the entire contents and disclosures of which are hereby incorporated herein by reference in their entirety.

FIELD OF THE DISCLOSURE

The present disclosure relates generally to building, simulating, and validating a machine learning predictive model, and more particularly, to a network-based system and method that uses large language models to build, simulate, and validate a predictive model for generating an output along with supporting and explanatory information.

BACKGROUND

Analysis of large systems may require significant amounts of data and time to (i) determine if there are issues with the functioning and output of these large systems, and (ii) determine how solutions to those issues should be implemented to address them. Furthermore, some analysis systems may have significant numbers of inputs and variables that affect the ease and time for analysis. Large language models (LLM) may be used for analysis of many systems. However, they are not a one size fits all solution.

Many systems have special features that may or may not be handled by the standard large language model. For example, in some cases, computer models are built and validated by individual programmers before being submitted for approval and then deployed for general use. Building and validating these computer models are extremely technical, requiring a great deal of specialized knowledge and experience. They are also very time consuming to create and deploy. For example, in the insurance industry, predictive pricing models and sub-models are routinely created, updated, and used for personal automobile and homeowners' insurance in deciding what coverage a person may be eligible for and how much premium they may have to pay. These computer models may include computer code that may be used to process data associated with a person or a group of people and then output a result. Changes to the models, and thus, changes to the computer code are oftentimes required. Standard large language models have not been used to address the challenges with building, testing, and validating these predictive pricing models in the insurance industry.

Another challenge in the insurance industry is that changes to these predictive pricing models typically require a licensed actuarial to approve any changes before the change request is submitted to a department of insurance. For that reason, the actuarial may have to be involved throughout the process of building the new predictive pricing model, and may have to create documentation supporting the change that must then be submitted to the department of insurance so that the regulators are also able to easily understand the changes being made to the model and that the changes are needed. The current process of building, validating, and submitting the predictive pricing model change is quite manual in nature and quite time consuming, requiring a great deal of the actuarial analysts' time.

The ability to use large language models and generative AI to address the challenges of detecting, building, testing, and validating various computer models including predictive pricing models for the insurance industry, and generating supporting documentation to explain the changes made is needed. Conventional large language models and generative AI tools do not currently address these challenges. Conventional techniques may have additional ineffectiveness, inefficiencies, encumbrances, and/or other drawbacks, as well.

BRIEF SUMMARY

The present embodiments may relate to, inter alia, a system analysis tool that may customize a large language model to work specifically for the system being analyzed. Further, the present embodiments may relate to building, simulating, and validating a machine learning model, and more particularly, to a network-based system and computer-implemented method that uses large language models to build, simulate, and validate a predictive pricing model for calculating insurance rates for one or more insurance products. The computer systems and computer-implemented methods described herein may provide for automating the more time-consuming elements of the building, simulating, and validating of the predictive pricing model(s). These include, but are not limited to, detecting issues with previous predictive pricing models' output, analyzing the predictive pricing models, building model software templates including one or more code changes to the previous predictive pricing model, generating a simulation environment, executing the newly built model software template in the simulation environment, and/or updating the model software template based upon one or more outputs of the execution.

In one aspect, a computer system for building, simulating, and/or validating a predictive model may be provided. The computer system may include one or more local or remote processors, servers, sensors, memory units, transceivers, mobile devices, wearables, smart watches, smart glasses or contacts, augmented reality glasses, virtual reality headsets, mixed or extended reality headsets, voice bots, chat bots, ChatGPT bots, large language models (LLMs), and/or other electronic or electrical components, which may be in wired or wireless communication with one another. For instance, the computer system may include a computing device that may include at least one processor in communication with at least one memory device. The at least one processor may be configured to: (1) analyze one or more predictive pricing sub-models to detect one or more issues with the one or more predictive pricing sub-models; (2) execute a GPT model on the one or more predictive pricing sub-models, the GPT model trained to identify differences between predicted pricing outputted by the one or more predictive pricing sub-models and actual pricing for insurance related events, and identify data elements related to the pricing differential including, but not limited to, claims history, vehicle history, prior insurance history, and/or public records; (3) compare the one or more issues to one or more outputs of the GPT model; (4) in response to the comparison, generate a new model software template including one or more code changes to the one or more predictive pricing sub-models based upon the comparison; (5) generate a simulation environment based upon a plurality of data; (6) execute the new model software template in the simulation environment; and/or (7) update the new model software template based upon one or more outputs of the execution. The computer system may include additional, less, or alternate functionality, including that discussed elsewhere herein.

In another aspect, a computer-implemented method for building, simulating, and/or validating a machine learning model may be provided. The computer-implemented method may be performed by a computer device including at least one processor in communication with at least one memory device. The method may include: (1) analyzing one or more predictive pricing sub-models to detect one or more issues with the one or more predictive pricing sub-models; (2) executing a GPT model on the one or more predictive pricing sub-models, the GPT model trained to identify differences between predicted pricing outputted by the one or more predictive pricing sub-models and actual pricing for insurance related events, and identify data elements related to the pricing differential including, but not limited to, claims history, vehicle history, prior insurance history, and/or public records; (3) comparing the one or more issues to one or more outputs of the GPT model; (4) in response to the comparison, generating a model software template including one or more code changes to the one or more predictive pricing sub-models based upon the comparison; (5) generating a simulation environment based upon a plurality of data; (6) executing the new model software template in the simulation environment; and/or (7) updating the new model software template based upon one or more outputs of the execution. The computer-implemented method may include additional, less, or alternate actions, including those discussed elsewhere herein.

In another aspect, at least one non-transitory computer-readable media having computer-executable instructions embodied thereon may be provided. When executed by a computing device including at least one processor in communication with at least one memory device, the computer-executable instructions may cause the at least one processor to: (1) analyze one or more predictive pricing sub-models to detect one or more issues with the one or more predictive pricing sub-models; (2) execute a GPT model on the one or more predictive pricing sub-models, the GPT model trained to identify differences between predicted pricing outputted by the one or more predictive pricing sub-models and actual pricing for insurance related events, and identify data elements related to the pricing differential including, but not limited to, claims history, vehicle history, prior insurance history, and/or public records; (3) compare the one or more issues to one or more outputs of the GPT model; (4) in response to the comparison, generate a model software template including one or more code changes to the one or more predictive pricing sub-models based upon the comparison; (5) generate a simulation environment based upon a plurality of data; (6) execute the new model software template in the simulation environment; and/or (7) update the new model software template based upon one or more outputs of the execution. The computer-executable instructions may direct additional, less, or alternate functionality, including that discussed elsewhere herein.

Advantages will become more apparent to those skilled in the art from the following description of the preferred embodiments which have been shown and described by way of illustration. As will be realized, the present embodiments may be capable of other and different embodiments, and their details are capable of modification in various respects. Accordingly, the drawings and description are to be regarded as illustrative in nature and not as restrictive.

BRIEF DESCRIPTION OF THE DRAWINGS

The Figures described below depict various aspects of the systems and methods disclosed therein. It should be understood that each Figure depicts an embodiment of a particular aspect of the disclosed systems and methods, and that each of the Figures is intended to accord with a possible embodiment thereof. Further, wherever possible, the following description refers to the reference numerals included in the following Figures, in which features depicted in multiple Figures are designated with consistent reference numerals.

The Figures show drawings arrangements which are presently discussed herein. It is understood, however, that the present embodiments are not limited to the precise arrangements and instrumentalities shown.

Figure 1:
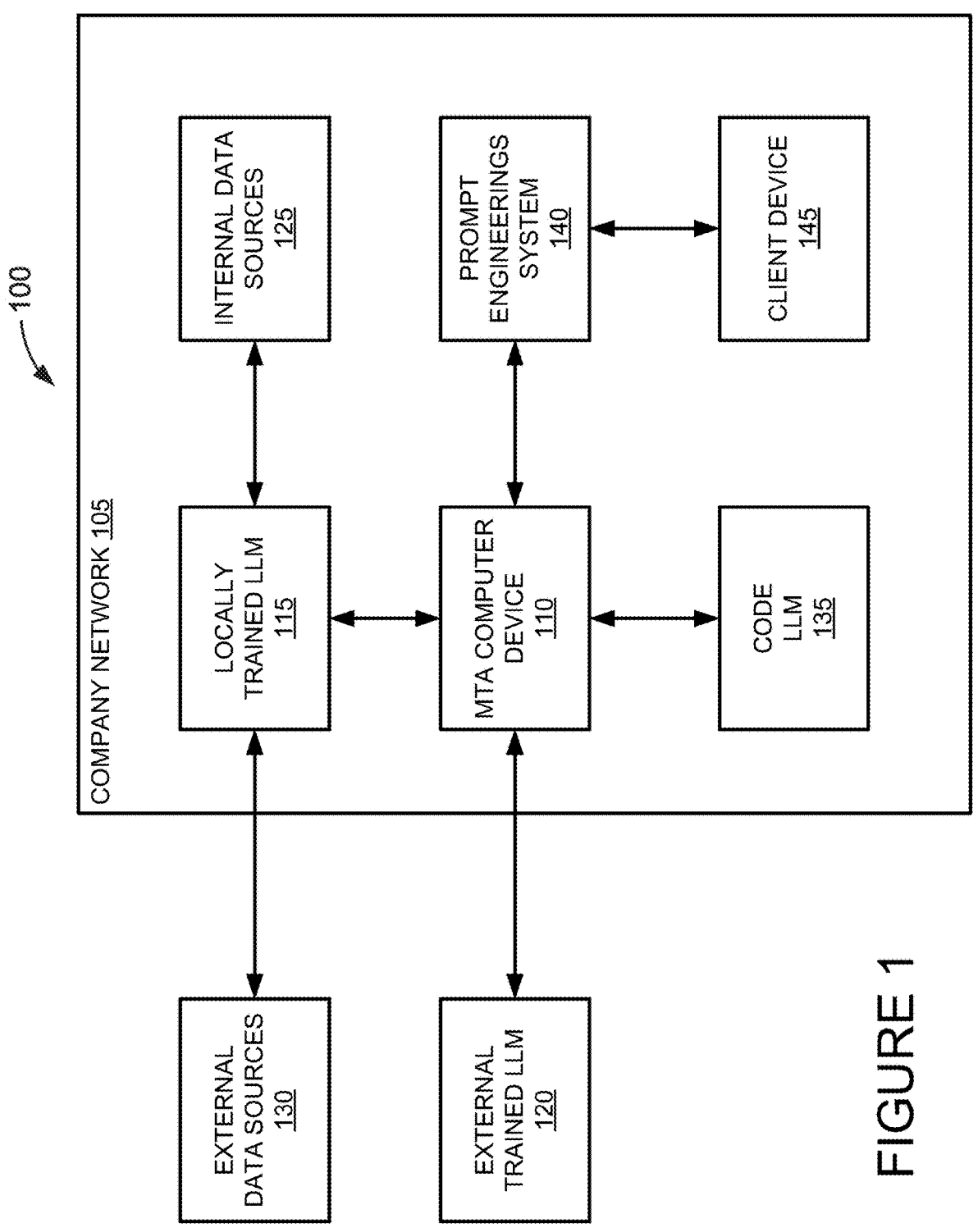
FIG. 1 illustrates an exemplary computer system for building, simulating, and validating large language models such as for predictive pricing models for predicting future pricing, in accordance with at least one embodiment.

The Figures depict preferred embodiments for purposes of illustration only. One skilled in the art will readily recognize from the following discussion that alternative embodiments of the systems and methods illustrated herein may be employed without departing from the principles of the invention described herein.

DETAILED DESCRIPTION OF THE DRAWINGS

The present disclosure relates generally to, inter alia, building, simulating, and validating a machine learning model, and more particularly, to a network-based system and method that uses large language models to build, simulate, and validate a predictive pricing model for calculating insurance rates for an insurance product. In one exemplary embodiment, the process may be performed by a model training and analysis (MTA) computer device. In the exemplary embodiment, the MTA computer device may be in communication with one or more client devices, one or more internal data sources, one or more external data sources, and one or more analysis models. As used herein, predictive pricing model means any model including an AI model for predicting prices or costs of a product or service. For example, in the insurance industry, a predictive pricing model may include, but is not limited to, credit models that may rely on credit data to train the models, or other predictive pricing models that may rely on other sources of data such as claims history data, vehicle history data, other public records data, and/or prior insurance history data. Any of this data may be used to train a predictive pricing model and/or be used as an input into the predictive pricing model.

As described below in further detail, the MTA computer device includes one or more large language models (LLM), such as GPT (Generative Pre-trained Transformers) models, and one or more supplemental models that are configured to curate data from internal and external sources to send to the one or more GPT models for either training the GPT models or inputting the curated data to an already trained model for generating an output. The one or more supplemental models are configured to leverage the one or more GPT models for their wide range of capabilities. In some embodiments, the GPT models may be trained to identify issues with exiting predictive pricing models including, but not limited to, identifying poorly performing pricing models that need to be updated, models that fail to include certain parameters that are predictive of pricing and need to be included, and/or models that may require adjustments to certain weighting factors used therein. For example, one or more of the GPT model may be executed to identify differences between predicted pricing (from a current predictive pricing model) and actual pricing for insurance related events. This may allow the model to identify differences created by an existing predictive pricing model and actual pricing that is being experienced. The GPT model may also be used to identify data elements that may potentially relate to or be the cause of the pricing differential. The data elements identified may include, but not be limited to, insurance claims history for the persons, assets or vehicles involved, vehicle history of the vehicle involved, prior insurance history for the persons, assets or vehicles involved, and/or public records relating to the same.

In various embodiments, the MTA computer device is also in communication with one or more computer code large language models tuned for generating, executing, and debugging software code. In some of these embodiments, the code LLM may be provided by and/or maintained by an external server. In additional embodiments, the MTA computer device may also be in communication with a prompt engineering system that receives natural language text and then converts that text into structured text for interpretation and comprehension by the generative AI (artificial intelligence).

In the exemplary embodiment, the MTA computer device may be configured to use the one of more GPT models, the one or more supplemental models, the code LLM, and the prompt engineering system to actively monitor complicated systems, identify potential issues with those systems, and/or propose solutions to the identified issues.

One exemplary computer system is an insurance rate filing system, such as those used in the insurance industry to calculate insurance rates or prices for an insurance product. In this example, the MTA computer device may be configured to monitor predicted pricing from a model for an insurance product in a jurisdiction, such as within a particular state within the United States. The MTA computer device is configured to detect differences between predicted pricing output from a predictive pricing sub-model for the jurisdiction as compared to the actual pricing experienced within the jurisdiction for the insurance product. The MTA computer device may execute one or more GPT models to identify data elements that may potentially relate to or be the cause of the pricing differential. The data elements identified may include, but not be limited to, insurance claims history for the persons, assets or vehicles involved, vehicle history of the vehicle involved, prior insurance history for the persons, assets or vehicles involved, and/or public records relating to the same. Additionally or alternatively, the MTA computer device may be programmed to analyze and monitor for trends associated with the differences so that the trends may be further analyzed to better identify the drivers or triggers of the differences and/or trends between different models. The MTA computer device may generate an action item to review the differences identified, and/or other discovered trends. Further, the MTA computer device may be configured to only trigger the generation of the action item when the trend or the differences exceed a predetermined threshold. Thresholds for the different insurance products or items may vary based upon historical analysis and user preferences.

As described above, the MTA computer device may be configured to monitor predicted pricing outputs from a model for an insurance product within a jurisdiction as compared to actual pricing amounts experienced. The MTA computer device is configured to detect differences between the predicted pricing output from a predictive pricing sub-model for the jurisdiction as compared to the actual pricing experienced within the jurisdiction for the insurance product. In addition, the MTA computer device may execute one or more GPT models to identify data elements that may potentially relate to or be the cause of the pricing differential. Accordingly, the GPT models used to detect the pricing differences and identify the data elements driving the pricing differences may be trained with a variety of historical insurance related data including for both a single type of insurance coverage and/or for different types of insurance coverage (e.g., life, home, personal mobility, and/or auto coverage) within different jurisdictions. For example, in the area of auto coverage, the insurance related data used to train the models may include data such as: amount of time with a prior insured; prior bodily injury limit; how long the applicant owned their prior vehicle; number of youthful drivers in household; number of youthful drivers using the vehicle; number of at-fault claims; number of at-fault medical claims; number of drivers in household; number of vehicles in household; age; state of vehicle ownership; homeownership; prior insurer; etc. This type of data may be used to train the models and may be identified as a driver for the pricing differences. Other data elements may be used for other types of insurance coverage.

The MTA computer device may activate a trained GPT model to analyze the pricing differences, and/or other discovered trends. In at least one embodiment, the trained GPT model may be trained with ten years (or more) of predictive pricing model history, core business events, and other relevant public and private data in order to identify differences between the predicted pricing and the actual pricing for an insurance product. The MTA computer device executes the trained GPT model to analyze the predictive pricing sub-model and the predicted pricing over the last eighteen months and produce a report describing the differences identified between the predicted pricing and the actual pricing along with any trends associated therewith. In some embodiments, the MTA computer device submits the action item determined based upon the analysis of the predictive pricing sub-model to one or more users and in response receives a prompt from the one or more users to instruct the trained GPT model to analyze the predictive pricing sub-model. In other embodiments, the MTA computer device may be prompted by the action item to determine a prompt for the trained GPT model based upon previous analysis and upon different attributes related to the pricing difference, or other discovered trends.

Based upon the predictive pricing sub-model analysis, the MTA computer device may determine that a model change should be investigated to address the differences between the predicted pricing and the actual pricing. In certain embodiments, the MTA computer system may determine the need for a model change based upon the analysis exceeding one or more thresholds. In other embodiments, the determination may be provided by the one or more users. The MTA computer device may instruct the code LLM to generate a model software template for the predictive pricing sub-model. Additionally or alternatively, the MTA computer device may instruct the code LLM to derive the model software template from the latest production model code.

The predictive pricing models described herein typically impact the rating of insurance products and many jurisdictions within the United States and Canada require that rate filings be approved by a credentialed actuary. Actuaries are bound by professionalism standards which include Actuarial Standards of Practice (ASOP). ASOP 1 states "ASOPs are binding on members of the U.S.-based actuarial organizations when rendering actuarial services in the U.S." Actuarial Services are defined in ASOP 1 as "Professional services provided to a principal by an individual acting in the capacity of an actuary. Such services include the rendering of advice, recommendations, findings or opinions based on actuarial considerations" which would reasonably include approving the filings of rate filings. Therefore, in those cases where the MTA computer system determines the need for a model change based upon the analysis exceeding one or more thresholds, the MTA computer system will provide reports to the assigned actuary explaining the issues identified and any changes made by the code LLM to generate a new model software template. Dashboards may also be used to better enable the actuary to approve the model changes and track the process of the submission.

In various embodiments, the MTA computer device may receive one or more prompts from the one or more users with instructions, either full or partial, to build the software model template. In some embodiments, the latest production model code may be limited to a specific jurisdiction. In other embodiments, the latest production model code may be limited based upon other factors, such as, but not limited to, specific insurance product, specific item being insured, specific category, and/or any other division of factors desired by the user and/or for compliance, such as with a government entity.

The code LLM may generate the requested model software component based upon the provided instructions. In the exemplary embodiment, the code LLM may generate the requested model software component based upon the previous implementation of the predictive pricing model. In some embodiments, the MTA computer device and/or the one or more users indicate where to place the updated math in the requested model software component. In other embodiments, the code LLM receives an input from the MTA computer device and/or the GPT model instructing the code LLM to generate new code (e.g., computer executable instructions) that will generate the change to the predictive pricing model and thus, the change to the insurance rate. Accordingly, the MTA computer device is configured to detect an issue with the existing predictive pricing model, identify the issue, and create updated code that may be deployed as part of a new predictive pricing model to address the issue detected.

The MTA computer device may gather the data necessary to simulate the desired predictive pricing model. The data may include data from internal and external data sources. In some embodiments, this data may have been previously retrieved and is stored in one or more databases that are accessible. The MTA computer device may create a simulation environment based upon the gathered data. Accordingly, after the code change is built and the new predictive pricing model is generated, the MTA computer device may deploy the new predictive pricing model in the simulation environment in order to test the new predictive pricing model. The actuary assigned to the matter may then be able to see how the new predictive pricing model performs with test data before submitting the rate change to the department of insurance. In addition, output from the simulation environment may be used to help generate supporting documents that are needed when the rate change is submitted.

In the exemplary embodiment, the MTA computer device may activate the template predictive pricing model. The MTA computer device and/or the code LLM may update the template predictive pricing model with the updated math and corresponding code. Then the MTA computer device may execute the updated predictive pricing model in the created simulation environment to output results data and generate one or more reports based upon the results data. For example, the MTA computer device may execute the updated predictive pricing model with 5 million records, and/or any other number of records to provide sufficient information and/or testing. In some embodiments, the MTA computer device may generate the one or more reports to include relevant statistics and recommendations for submitting the rate change request.

In the exemplary embodiment, the MTA computer device may analyze the report and/or the supporting data to make one or more adjustments to the calculations. Then the MTA computer device executes the simulation again. In the exemplary embodiment, the MTA computer device continues to iterate through execution of the updated predictive pricing model and make adjustments to the updated predictive pricing model multiple times. In some embodiments, the MTA computer device performs a predetermined number of simulation iterations. In other embodiments, the MTA computer device continues iterating through simulations until a steady state or one or more completion thresholds are reached.

In the exemplary embodiment, the MTA computer device determines that the updated predictive pricing model is ready for production and is passed on to other systems that will execute the updated predictive pricing model with live information. In some cases, the MTA computer device is configured to present the updated predictive pricing model along with any changes to the model to a designated party for review purposes. As described herein, in the United States and Canada, predictive pricing models that impact a rating of insurance products may require that rate change filings be approved by a credentialed actuary. Therefore, in those cases where the MTA computer device determines the need for a model change based upon the analysis exceeding one or more thresholds, the MTA computer device may provide reports to the assigned actuary explaining the issues identified and any changes made by the code LLM to generate a new model software template. Dashboards may also be used to better enable the actuary to approve the model changes and track the process of the submission. In other cases, the models being proposed for change may be presented to multiple designated parties for review and approval purposes throughout the change process. In some cases, these changed models may be presented to a party and the approval may be tracked through the MTA system such that an audit may be performed at any time to determine what changes were made to the model, who approved the changes, and when did this all happen. Reports can then be easily generated from this audit trail that is saved in the MTA system.

In one example insurance embodiment, the MTA computer device determines that the actual cost for repairing one or more models of vehicles greatly exceed the predicted costs for repairs of those vehicles generated by a previous predictive pricing model. Through analysis of the predictive pricing model, the MTA computer device may determine that certain expensive components of the models of vehicles are damaged during an off-center head-on collision. The MTA computer device executes the updated predictive pricing model to determine adjusted rates for insuring the one or more models of vehicles.

While the above describes using the systems and processes described herein for ratings future analysis and credit models, one having skill in the art would understand that these systems and methods may also be used for other types of analysis.

Exemplary Analysis System

FIG. 1 illustrates an exemplary computer system 100 for building, simulating, and/or validating large language models such as predictive pricing models that may be used in the insurance industry, in accordance with at least one embodiment of the present disclosure. In the exemplary embodiment, the system 100 may include one or more systems or devices inside of a company network 105 and one or more systems or devices outside of the network 105.

In the exemplary embodiment, the network 105 may include a model training and analysis (MTA) computer device 110. The MTA computer device 110 may begin communication with one or more locally trained large language models (LLM) 115 and one or more external trained LLMs 120. In at least one embodiment, the large language models may be GPT (Generative Pre-trained Transformers) models.

In the exemplary embodiment, the local trained LLM 115 may receive data from internal data sources 125 and external data sources 130. The internal data sources 125 may include data about clients and/or customers, such as PII, personally identifiable information. The internal data sources 125 may also include proprietary information that is private to the company associated with the network 105. For example, the internal data sources 125 may include data relating to insurance claims history for persons, assets or vehicles at issue, vehicle history of vehicles at issue, prior insurance history for persons, assets or vehicles involved, and/or other similar data.

The external data sources 130 may include publicly available information. The external data sources 130 may also include private information that is being provided by the owners of that information, such as a third-party vendor. The locally trained LLM 115 is configured to curate the internal information is trained to handle some internal analysis. The locally trained LLM 115 may also be trained to interact with the external LLM 120 through the MTA computer device 110.

In some embodiments, the locally trained LLM 115 and/or the MTA computer device 110 may be configured to protect PII from being passed to the external LLM 120. This may include actions, such as, but not limited to, analyzing the data being communicated with the external LLM 120 and masking or otherwise obfuscating PII or other private information when detected.

In the exemplary embodiment, the external LLM 120 are significant trained models executed by external servers. In one embodiment, the external LLM 120 may include a GPT LLM model. In the exemplary embodiment, the MTA computer device 110 may be configured to communicate with the external LLM 120 to execute trained models and gather information from the external LLM 120 based upon information provided by the locally trained LLM 115. The locally trained LLM 115 and/or the MTA computer device 110 may be configured to leverage the external LLMs 120 for their wide range of capabilities.

In the exemplary embodiment, the MTA computer device 110 may also be in communication with one or more code large language models (LLMs) 135 tuned for generating, executing, and debugging software code. In some of these embodiments, the code LLM 135 may be internal to the network 105. In other embodiments, the code LLM 135 may be provided by and/or maintained by one or more external servers.

In additional embodiments, the MTA computer device 110 may also be in communication with at prompt engineering system 140 that receives natural language text and then converts that text into structured text for interpretation and comprehension by generative AI (artificial intelligence). In some embodiments, the prompt engineering system 140 may be internal to the MTA computer device 110. In other embodiments the prompt engineering system 140 may be separate from the MTA computer device 110. In at least one embodiment, the prompt engineering system 140 acts as an interface between the MTA computer device 110 and one or more client device 145 associated with one or more users.

Figure 2:
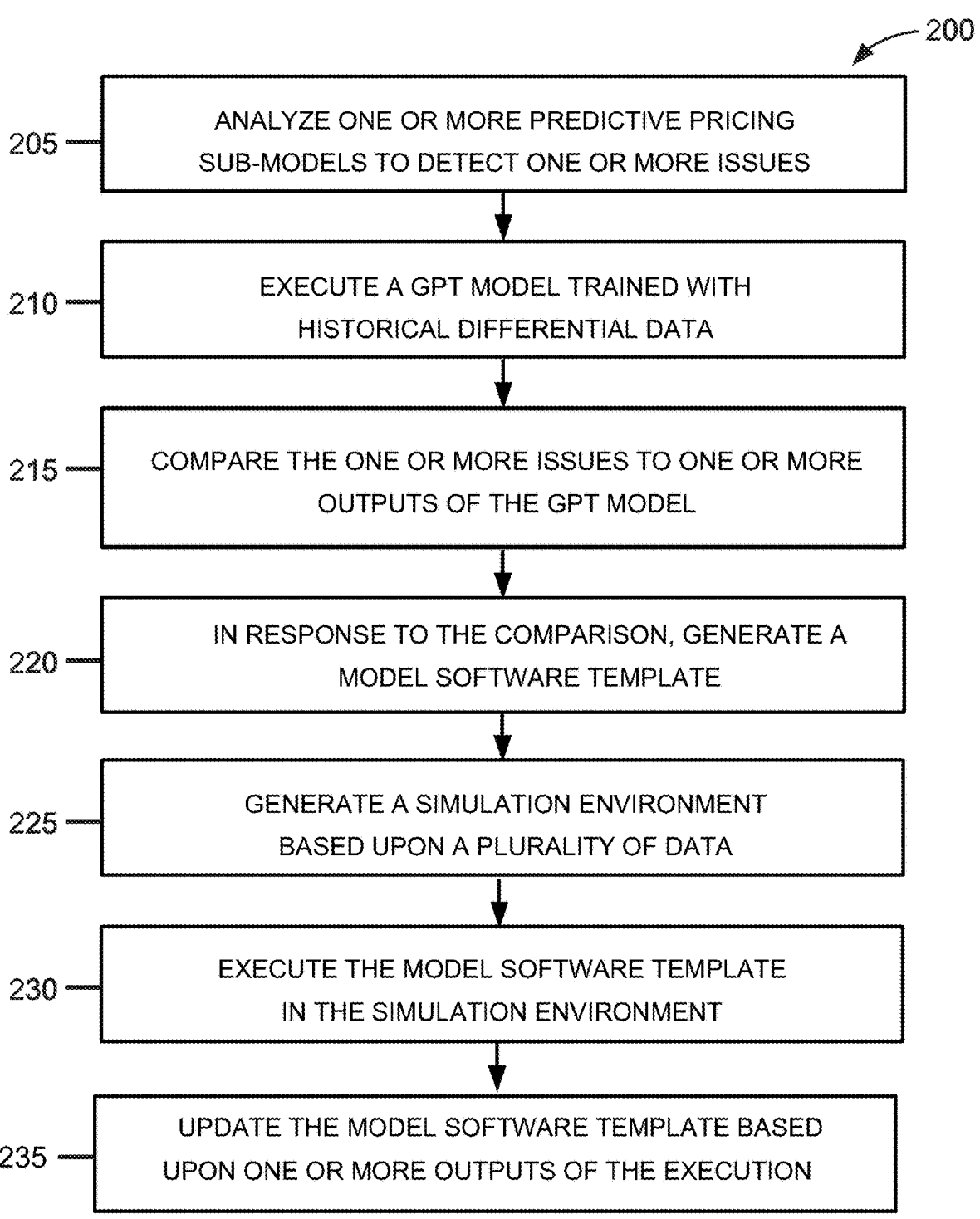
FIG. 2 illustrates an exemplary computer implemented process for building, simulating, and validating large language models such as for predictive pricing models using the system shown in FIG. 1.

In the exemplary embodiment, the MTA computer device 110 may be configured to use the locally trained LLMs 115, the external LLM 120, the code LLM 135, and the prompt engineering system 140 to actively monitor complicated systems, identify potential issues with those systems, and/or propose solutions to the identified issues as described for example in FIG. 2.

Exemplary Rate Analysis Process

FIG. 2 illustrates an exemplary computer-implemented or computer-based process 200 for building, simulating, and/or validating large language models, such as for predictive pricing models using the system 100 (shown in FIG. 1). In the exemplary embodiment, the functionality or operations of process 200 may be performed by the MTA computer system 110 (shown in FIG. 1) in communication with one or more locally trained LLMs 115, one or more external trained LLMs 120, one or more code LLMs 135, and/or a prompt engineering system 140 (all shown in FIG. 1).

In one exemplary embodiment of analysis process 200, MTA computer system 110 is configured to analyze one or more predictive pricing models that may be used in the insurance industry for detecting one or more issues with the one or more predictive pricing models. In this example, the MTA computer device 110 may be configured to monitor pricing in a jurisdiction, such as a state; the pricing associated with repairing or replacing a particular type of asset or vehicle; and/or the pricing associated with medical expenses or life expectancy. In the exemplary embodiment, the MTA computer device 110 analyzes 205 one or more predictive pricing sub-models to detect one or more issues using one or more GPT models for performing the analysis. The MTA computer device 110 may detect a consistent variance for target fitting for a credit sub-model for the jurisdiction. In other words, the MTA computing device 110 may be configured to analyze one or more predictive pricing sub-models to detect one or more issues with the one or more predictive pricing sub-models, and then execute a GPT model trained to identify differences between a predicted pricing and an actual pricing for insurance related events, and identify data elements potentially related to the pricing differential including, but not limited to, claims history, vehicle history, prior insurance history, and/or public records. The MTA computer device 110 may also be programmed to analyze and monitor for trends associated with the differences among different jurisdictions and/or different persons, assets, or vehicles and/or between different sub-models. The MTA computer device 110 generates an action item to review the consistent variance, and/or other discovered trends. The MTA computer device 110 may be configured to only trigger the generation of the action item when the trend or fitting variance exceeds a predetermined threshold. Thresholds for the different items may vary based upon historical analysis and user preferences.

In the exemplary embodiment, the MTA computer device 110 may execute 210 a GPT model trained with a variety of data for identifying pricing differentials between predicted and actual pricings including, but not limited to, insurance claims history for persons, assets and/or vehicles, vehicle history pricing for repair and/or replacement, prior insurance history, and/or public records related thereto. The MTA computer device 110 activates a locally trained LLM 115 to analyze the consistent variance between the predicted and actual pricing, or other discovered trends. In at least one embodiment, the locally trained LLM 115 may be trained with ten years of predictive pricing model history, core business events, and other relevant public and private data.

The MTA computer device 110 may execute the locally trained LLM 115 to analyze the current predictive pricing model and fit over the last eighteen months and produce analysis description of the trends. In one aspect, the MTA computer device 110 may execute 210 the one or more locally trained LLM 115 to identify differences between predicted pricing and actual pricing for insurance related events, and/or identify data elements potentially related to the pricing differential including, but not limited to, claims history, vehicle history, prior insurance history, and/or public records.

In some embodiments, the MTA computer device 110 may submit the action item to one or more users via associated client devices 145 (shown in FIG. 1) and in response receives a prompt, via the prompt engineering system 140, from the one or more users via their client devices 145 to instruct the locally trained LLM 115 to analyze the credit model in view of the pricing differences and/or other identified issues with the current predictive pricing model. In other embodiments, the MTA computer device 110 may be prompted by the action item to determine the prompt for the locally trained LLM 115 based upon previous analysis and upon different attributes related to the consistent variance, and/or other discovered trends. In some embodiments, the MTA computer device 110 determines the prompt for the locally trained LLM 115 using the prompt engineering system 140.

In the exemplary embodiment, the MTA computer device 110 compares 215 the one or more issues to one or more outputs of the GPT model. Based upon the predictive pricing model analysis, the MTA computer device 110 may determine that a model change should be investigated. In some embodiments, the MTA computer system 110 determines the need for a model change based upon the analysis exceeding one or more thresholds. In other embodiments, the determination may be provided by the one or more users via their client devices 145.

In response to the comparison, the MTA computer device 110 generates 220 a model software template including one or more code changes based upon the comparison. The MTA computer device 110 instructs the code LLM 135 to generate a model software template for the predictive pricing model. The MTA computer device 110 instructs the code LLM 135 to derive the model software template from the latest production model code. In some embodiments, the MTA computer device 110 receives one or more prompts from the one or more users, via their client devices 145 and the prompt engineering system 140, with instructions, either full or partial, to build generate the software model template. In other words, after the MTA computer device 110 identifies an issue with a current predictive pricing model, the MTA computer device 110 may then utilize the code LLM 135 to generate new computer code to address the issue with the predictive pricing model. The new code will be executable by a computing device to generate new pricing data from the updated model that will more accurately predict the actual costs for insurance purposes.

In some embodiments, the latest production model code may be limited to a specific jurisdiction. In other embodiments, the latest production model code is limited based upon other factors, such as, but not limited to, a specific vehicle, a specific asset, a specific category of assets, a specific type of insurance coverage, a category of persons, a health-related category, and/or any other division of factors desired by the user and/or for compliance, such as with a government entity.

The code LLM 135 generates the requested model software component based upon the provided instructions. In the exemplary embodiment, the code LLM 135 generates the requested model software component based upon the previous implementation of the predictive pricing model. In other words, the code LLM 135 may generate an update for the previous model to address the issues and provide more accurate pricing predictions. In some embodiments, the MTA computer device 110 and/or the one or more users indicate where to place updated math in the requested model software component.

In the exemplary embodiment, the MTA computer device 110 may generate 225 a simulation environment based upon a plurality of data. The MTA computer device 110 gathers the data necessary to simulate the desired predictive pricing model. The data may include data from internal data sources 125 and external data sources 130. In some embodiments, this data has been previously retrieved and is stored in one or more databases to be accessible—either locally or remotely. The MTA computer device 110 creates a simulation environment based upon the gathered data.

In the exemplary embodiment, the MTA computer device 110 may generate 225 a simulation environment based upon a plurality of data. The MTA computer device 110 activates the template predictive pricing model. The MTA computer device 110 and/or the code LLM 135 updates the template predictive pricing model with the updated math and corresponding code.

Then the MTA computer device 110 executes 230 the updated predictive pricing model in the created simulation environment to output results data and generate one or more reports based upon the results data. For example, the MTA computer device 110 may execute 230 the updated predictive pricing model with 5 million records, and/or any other number of records to provide sufficient information and/or testing. In some embodiments, the MTA computer device 110 generates the one or more reports to include relevant statistics and recommendations with any reports outputted to designated parties within the insurance company. These reports may be used when preparing the final rate change request that is submitted to a department of insurance requesting that the predictive pricing model and rates charged to provide insurance be changed in accordance with the reports outputted by the system.

In the exemplary embodiment, the MTA computer device 110 may update 235 the model software template based upon one or more outputs of the execution. The MTA computer device 110 analyzes the report and/or the supporting data to make one or more adjustments to the calculations. Then the MTA computer device 110 executes the simulation again. In the exemplary embodiment, the MTA computer device 110 continues to iterate through execution of the updated credit model and adjustment of the updated credit model multiple times.

In some embodiments, the MTA computer device 110 performs a predetermined number of simulation iterations. In other embodiments, the MTA computer device 110 continues iterating through simulations until a steady state or one or more end conditions are reached.

In the exemplary embodiment, the MTA computer device 110 determines that the updated predictive pricing model is ready for production and is passed on to other systems that will execute the updated predictive pricing model with live information. This new model may be deployed after internal approval by the designated persons within the insurance company and after approval by the appropriate insurance regulators. Once deployed, the model and its outputs are constantly monitored to ensure that it is functioning in the proper manner as demonstrated when used in the simulation environment. Outputs from the live deployment are compared to outputs from the simulation environment to monitor the accuracy of the model.

The execution of the predictive pricing models above may be performed by one or more of the locally trained LLM 115 and the external LLM 120. In some embodiments, analysis and models generated based upon publicly available data are executed with the external LLMs 120. In other embodiments, the external LLMs 120 may be used to power the one or more locally trained LLMs 115.

In one exemplary insurance embodiment, the MTA computer device 110 determines that the actual cost for repairing one or more models of vehicles greatly exceed the previous predicted costs for repairs of those vehicles. Through analysis of the predictive pricing model, the MTA computer device 110 determines that certain expensive components of the models of vehicles are damaged during an off-center head-on collision. The MTA computer device 110 executes the updated predictive pricing model to determine adjusted rates for insuring the one or more models of vehicles.

While the above describes using the systems and processes described herein for ratings future analysis and pricing models, one having skill in the art would understand that these systems and methods may also be used for other types of analysis.

Exemplary Computer System

Figure 3:
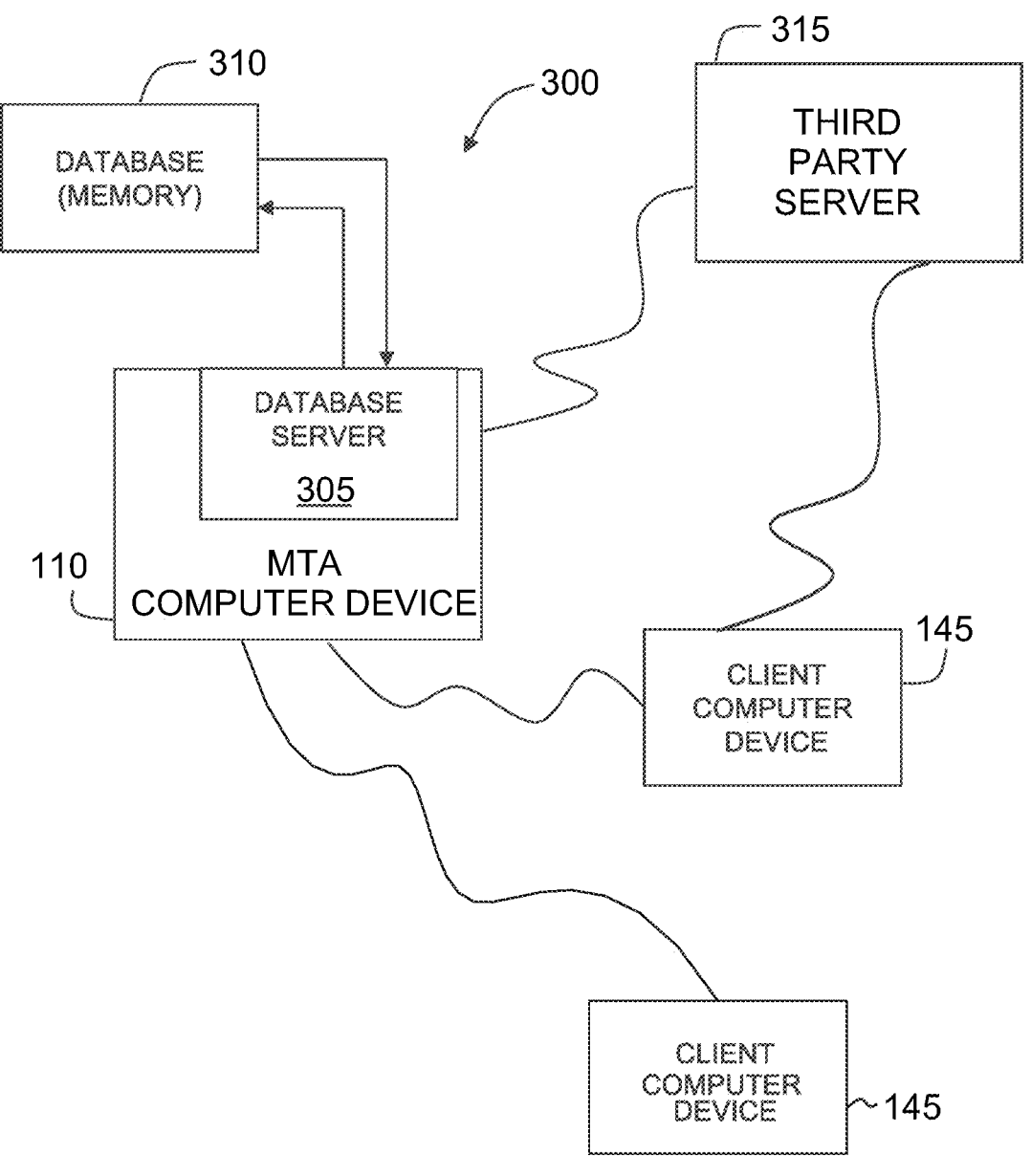
FIG. 3 illustrates an exemplary computer system for performing the processes shown in FIG. 2.

FIG. 3 illustrates an exemplary computer system 300 for performing the process 200 (shown in FIG. 2). In the exemplary embodiment, the system 300 may be used for rating analysis, credit models, and/or for multiple model analysis.

As described below in more detail, the model training and analysis (MTA) computer device 110 may be programmed for rating or rate change analysis. In addition, the MTA computer system 110 may be programmed to coordinate the communication and execute of large language models (LLM). In some embodiments, the MTA computer system 110 may be programmed to (1) analyze one or more predictive pricing sub-models to detect one or more issues with the one or more predictive pricing sub-models; (2) execute a GPT model trained to identify differences between predicted pricing and actual pricing for insurance related events, and/or identify data elements potentially related to the pricing differential including, but not limited to, claims history, vehicle history, prior insurance history, and/or public records; (3) compare the one or more issues to one or more outputs of the GPT model; (4) in response to the comparison, generate a new model software template including one or more code changes to the one or more predictive pricing sub-models based upon the comparison; (5) generate a simulation environment based upon a plurality of data; (6) execute the new model software template in the simulation environment; and/or (7) update the new model software template based upon one or more outputs of the execution. The computer system may include additional, less, or alternate functionality, including that discussed elsewhere herein.

In the exemplary embodiment, client devices 145 may be computers or computing devices that include a web browser or a software application, which enables client devices 145 to communicate with MTA computer system 110 using the Internet, a local area network (LAN), or a wide area network (WAN). In some embodiments, the client devices 145 are communicatively coupled to the Internet through many interfaces including, but not limited to, at least one of a network, such as the Internet, a LAN, a WAN, or an integrated services digital network (ISDN), a dial-up-connection, a digital subscriber line (DSL), a cellular phone connection, a satellite connection, and a cable modem. Client devices 145 may be any device capable of accessing a network, such as the Internet, including, but not limited to, a desktop computer, a laptop computer, a personal digital assistant (PDA), a cellular phone, a smartphone, a tablet, a phablet, wearable electronics, smart watch, virtual headsets or glasses (e.g., AR (augmented reality), VR (virtual reality), MR (mixed reality), or XR (extended reality) headsets or glasses), chat bots, voice bots, ChatGPT bots or ChatGPT-based bots, or other web-based connectable equipment or mobile devices.

In the exemplary embodiment, the MTA computer system 110 (also known as MTA server 110) may be a computer that includes a web browser or a software application, which enables MTA computer system 110 to communicate with client devices 145 using the Internet, a local area network (LAN), or a wide area network (WAN). In some embodiments, the MTA computer system 110 may be communicatively coupled to the Internet through many interfaces including, but not limited to, at least one of a network, such as the Internet, a LAN, a WAN, or an integrated services digital network (ISDN), a dial-up-connection, a digital subscriber line (DSL), a cellular phone connection, a satellite connection, and a cable modem. MTA computer system 110 can be any device capable of accessing a network, such as the Internet, including, but not limited to, a desktop computer, a laptop computer, a personal digital assistant (PDA), a cellular phone, a smartphone, a tablet, a phablet, wearable electronics, smart watch, virtual headsets or glasses (e.g., AR (augmented reality), VR (virtual reality), MR (mixed reality), or XR (extended reality) headsets or glasses), chat bots, voice bots, ChatGPT bots or ChatGPT-based bots, or other web-based connectable equipment or mobile devices.

A database server 305 may be communicatively coupled to a database 310 that stores data. In one embodiment, the database 310 may be a database that includes one or more large language models and/or private information. In some embodiments, the database 310 is stored remotely from the MTA computer system 110. In some embodiments, the database 310 is decentralized. In the exemplary embodiment, a person may access the database 310 via the client devices 145 by logging onto MTA computer system 110.

Third-party servers 315 may be any third-party server that MTA computer system 110 is in communication with that provides additional functionality and/or information to MTA computer system 110. For example, third-party server 315 may host external LLM 120 (shown in FIG. 1) and/or may be an external data source 130 (shown in FIG. 1).

In the exemplary embodiment, third-party servers 315 may be computers that include a web browser or a software application, which enables third-party servers 315 to communicate with MTA computer system 110 using the Internet, a local area network (LAN), or a wide area network (WAN). In some embodiments, the third-party server 315 are communicatively coupled to the Internet through many interfaces including, but not limited to, at least one of a network, such as the Internet, a LAN, a WAN, or an integrated services digital network (ISDN), a dial-up-connection, a digital subscriber line (DSL), a cellular phone connection, a satellite connection, and a cable modem. Third-party servers 315 may be any device capable of accessing a network, such as the Internet, including, but not limited to, a desktop computer, a laptop computer, a personal digital assistant (PDA), a cellular phone, a smartphone, a tablet, a phablet, wearable electronics, smart watch, virtual headsets or glasses (e.g., AR (augmented reality), VR (virtual reality), MR (mixed reality), or XR (extended reality) headsets or glasses), chat bots, voice bots, ChatGPT bots or ChatGPT-based bots, or other web-based connectable equipment or mobile devices.

Exemplary Server Device

Figure 4:
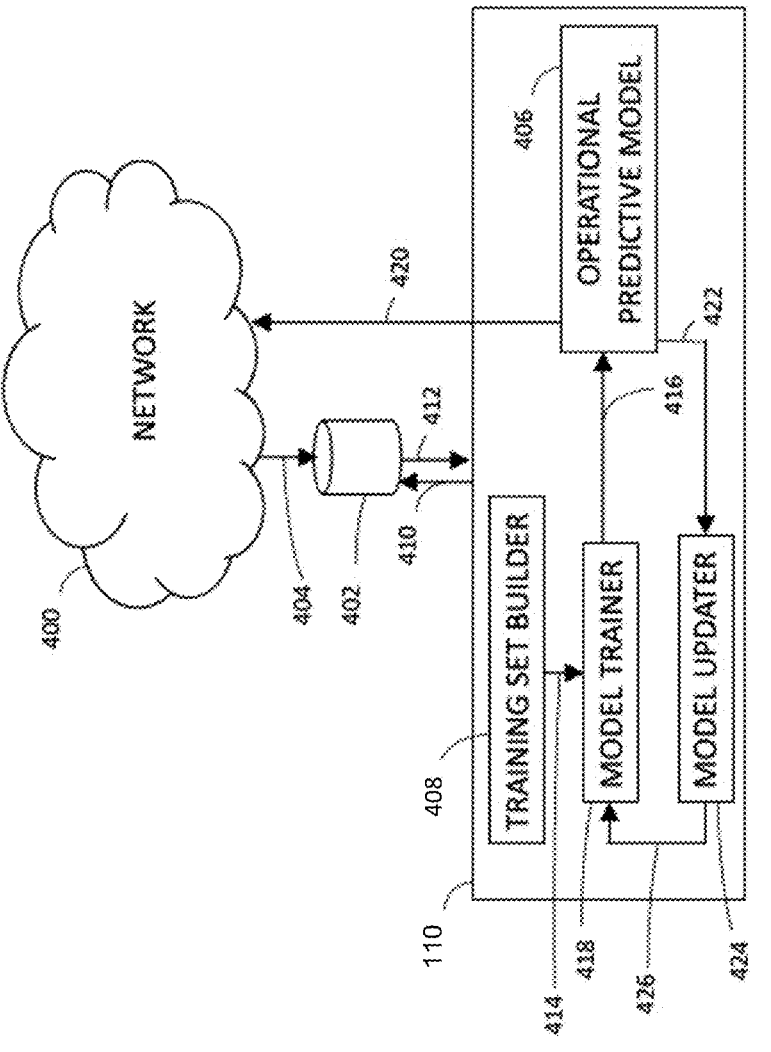
FIG. 4 is a schematic diagram of an exemplary model training and analysis (MTA) server shown in FIG. 1 that may be used with the systems shown in FIGS. 1 and 3.

FIG. 4 is a schematic diagram of an exemplary model training and analysis (MTA) server 110 (shown in FIG. 1), that may be used with the systems 100 and 300 (shown in FIGS. 1 and 3). MTA server 110 may communicate with other components of system 300, such as third-party servers 315 (shown in FIG. 3), client computer devices 145, external data sources 130, prompt engineering system 140, locally trained LLM 115, and/or code LLM 135, via a network 400.

MTA server 110 may include and/or be in communication with a database 402 that stores data 404, such as database 310 (shown in FIG. 3), stored records generated by MTA server 110, and/or any other relevant data as described herein. Data 404 received from network 400 may be stored in database 402. MTA server 110 may configured to use data 404 to generate an operational large language model module 406 for controlling operations of MTA server 310 (e.g., in accessing third-party databases via a digital portal), predicting outcomes of claims, generating action recommendations in response to operational requests, and the like. As described above, operational LLM module 406 may include at least one processor configured to: analyze one or more predictive pricing sub-models to detect one or more issues with the one or more predictive pricing sub-models, and execute the LLM that is trained to identify differences between predicted pricing and actual pricing for insurance related events, and/or identify data elements potentially related to the pricing differential including, but not limited to, claims history, vehicle history, prior insurance history, and/or public records. The operational LLM module 406 may also compare the one or more issues to one or more outputs of the LLM model, and in response to the comparison, generate a new model software template including one or more code changes to the one or more predictive pricing sub-models based upon the comparison. The LLM module 406 may then deploy the new model in a simulation environment, and execute the new model software template in the simulation environment. The operational LLM module 406 may then update the new model software template based upon one or more outputs of the execution.

In exemplary embodiments, MTA server 110 may include a training set builder module 408 configured to submit one or more queries 410 to database 402 to retrieve subsets 412 of data 404, and to use those subsets 412 to build training data sets 414 for generating operational large language model 406. For example, query 410 may be configured to retrieve certain fields from data 404 for a specific vehicle, a specific asset, specific category of assets, a specific type of insurance coverage, a category of persons, a health-related category, and/or any other division of factors desired by the user and/or for compliance, such as with a government entity.

In various embodiments, training set builder module 408 may be configured to derive training data sets 414 from retrieved subsets 412. Each training data set 414 corresponds to a historical data 404 ("historical" in this context means completed in the past, as opposed to completed in real-time with respect to the time of retrieval by training set builder module 122). Each training data set 414 may include "model input" data fields along with at least one "result" data field representing a historical outcome associated with the model input. The model input data fields represent factors that may be expected to, or unexpectedly be found during model training to, have some correlation.

In exemplary embodiments, the model input data fields in training data sets 414 may be generated from data fields in subset 412 corresponding to historical data 404. In other words, a trained machine learning model 416 produced by a model trainer module 418 for use by operational predictive model module 406 is trained to make predictions based upon input values that can be generated from the data fields in data 404. Values in the model input data fields may include values copied directly from values in a corresponding data field in the retrieved subset 412, and/or values generated by modifying, combining, or otherwise operating upon values in one or more data fields in the retrieved subset 412. The use of such data fields as model input data fields facilitates the machine learning model in weighing these factors directly.

After training set builder module 408 generates training data sets 414, training set builder module 408 passes the training data sets 414 to model trainer module 418. In certain embodiments, model trainer module 418 may be configured to apply the model input data fields of each training data set 414 as inputs to one or more machine learning models. Each of the one or more machine learning models may be programmed to produce, for each training data set 414, at least one output intended to correspond to, or "predict," a value of the at least one result data field of the training data set 414. "Machine learning" refers broadly to various algorithms that may be used to train the model to identify and recognize patterns in existing data in order to facilitate making predictions for subsequent new input data.

Model trainer module 418 may be configured to compare, for each training data set 414, the at least one output of the model to the at least one result data field of the training data set 414, and apply a machine learning algorithm to adjust parameters of the model in order to reduce the difference or "error" between the at least one output and the corresponding at least one result data field. In this way, model trainer module 418 trains the machine learning model to accurately predict the value of the at least one result data field.

In other words, model trainer module 418 cycles the one or more machine learning models through the training data sets 414, causing adjustments in the model parameters, until the error between the at least one output and the at least one result data field falls below a suitable threshold, and then uploads at least one trained machine learning model 416 to operational large language model module 406 for application to generating recommendations 420. In exemplary embodiments, model trainer module 418 may be configured to simultaneously train multiple candidate machine learning models and to select the best performing candidate for each result data field, as measured by the "error" between the at least one output and the corresponding result data field, to upload to operational predictive model module 406.

In certain embodiments, the one or more machine learning models may include one or more neural networks, such as a convolutional neural network, a deep learning neural network, or the like. The neural network may have one or more layers of nodes, and the model parameters adjusted during training may be respective weight values applied to one or more inputs to each node to produce a node output. In other words, the nodes in each layer may receive one or more inputs and apply a weight to each input to generate a node output. The node inputs to the first layer may correspond to the model input data fields, and the node outputs of the final layer may correspond to the at least one output of the model, intended to predict the at least one result data field. One or more intermediate layers of nodes may be connected between the nodes of the first layer and the nodes of the final layer.

As model trainer module 418 cycles through the training data sets 414, model trainer module 418 applies a suitable backpropagation algorithm to adjust the weights in each node layer to minimize the error between the at least one output and the corresponding result data field. In this fashion, the machine learning model is trained to produce output that reliably predicts the corresponding result data field. Alternatively, the machine learning model may have any suitable structure.

In some embodiments, model trainer module 418 may provide an advantage by automatically discovering and properly weighting complex, second- or third-order, and/or otherwise nonlinear interconnections between the model input data fields and the at least one output. Absent the machine learning model, such connections are unexpected and/or undiscoverable by human analysts.

The MTA server 110 of the present disclosure may be configured to operate on input data related to predictive pricing models including to build, simulate, and validate a predictive pricing model and/or sub-model for calculating insurance rates for an insurance product. In one exemplary embodiment, MTA server 110 executes the operational large language model module 402 programmed to learn, without limitation, outcomes of claims based upon varying events and details, relevant data sources for evidence, the queries used to prompt a user to provide relevant information, features of claims or evidence related to potential fraud, and the like.

To facilitate this learning, MTA server 110 may include one or more databases 402 at which the data, including data as well as responses, evidence, outcomes, etc., is stored. This data becomes one or more input training sets used by the training set builder 408. Model outputs can be formatted for presentation or review as visual representations of recommendations, as text-based or natural language recommendations, and the like. In exemplary embodiments, operational predictive model module 406 may compare feedback, and may route a comparison result 422 generated by comparing recommendation 420 to the feedback to a model updater module 424 of MTA server 110. Model updater module 424 is configured to derive a correction signal 426 from comparison results 422 received for one or more recommendations, and to provide correction signal 426 to model trainer module 418 to enable updating or "re-training" of the at least one machine learning model to improve performance. The retrained at least one machine learning model 416 may be periodically re-uploaded to operational predictive model module 406.

Exemplary Client Device

Figure 5:
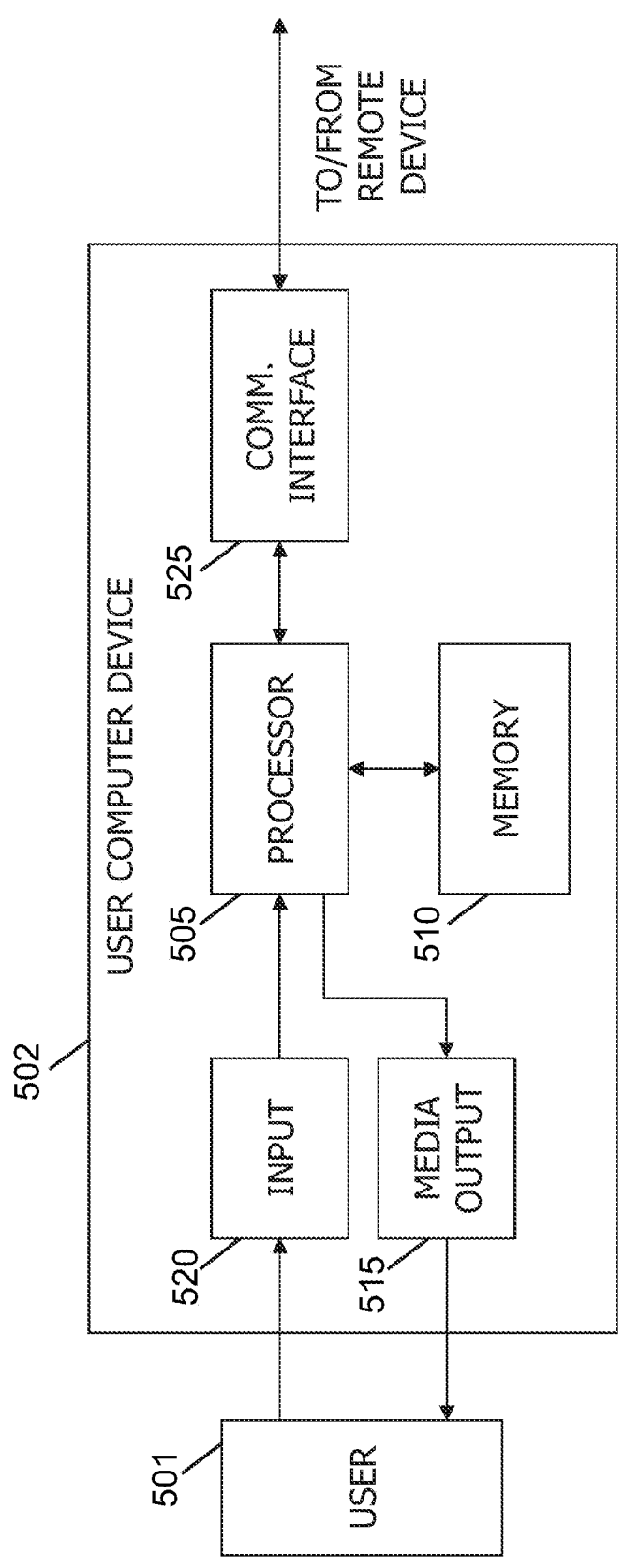
FIG. 5 illustrates an exemplary configuration of a user computer device, in accordance with one embodiment of the present disclosure.

FIG. 5 depicts an exemplary configuration 500 of user computer device 502, in accordance with one embodiment of the present disclosure. In the exemplary embodiment, user computer device 502 may be similar to, or the same as, client device 145 (shown in FIG. 1). User computer device 502 may be operated by a user 501.

User computer device 502 may include a processor 505 for executing instructions. In some embodiments, executable instructions may be stored in a memory area 510. Processor 505 may include one or more processing units (e.g., in a multi-core configuration). Memory area 510 may be any device allowing information such as executable instructions and/or transaction data to be stored and retrieved. Memory area 510 may include one or more computer readable media.

User computer device 502 may also include at least one media output component 515 for presenting information to user 501. Media output component 515 may be any component capable of conveying information to user 501. In some embodiments, media output component 515 may include an output adapter (not shown) such as a video adapter and/or an audio adapter. An output adapter may be operatively coupled to processor 505 and operatively couplable to an output device such as a display device (e.g., a cathode ray tube (CRT), liquid crystal display (LCD), light emitting diode (LED) display, or "electronic ink" display) or an audio output device (e.g., a speaker or headphones).

In some embodiments, media output component 515 may be configured to present a graphical user interface (e.g., a web browser and/or a client application) to user 501. A graphical user interface may include, for example, an interface for viewing items of information provided by the MTA computer system 110 (shown in FIG. 1). In some embodiments, user computer device 502 may include an input device 520 for receiving input from user 501. User 501 may use input device 520 to, without limitation, provide information either through speech or typing.

Input device 520 may include, for example, a keyboard, a pointing device, a mouse, a stylus, a touch sensitive panel (e.g., a touch pad or a touch screen), a gyroscope, an accelerometer, a position detector, a biometric input device, and/or an audio input device. A single component such as a touch screen may function as both an output device of media output component 515 and input device 520.

User computer device 502 may also include a communication interface 525, communicatively coupled to a remote device such as MTA computer system 110. Communication interface 525 may include, for example, a wired or wireless network adapter and/or a wireless data transceiver for use with a mobile telecommunications network.

Stored in memory area 510 are, for example, computer readable instructions for providing a user interface to user 501 via media output component 515 and, optionally, receiving and processing input from input device 520. A user interface may include, among other possibilities, a web browser and/or a client application. Web browsers enable users, such as user 501, to display and interact with media and other information typically embedded on a web page or a website from MTA computer system 110. A client application may allow user 501 to interact with, for example, MTA computer system 110. For example, instructions may be stored by a cloud service, and the output of the execution of the instructions sent to the media output component 515.

Exemplary Server Device

Figure 6:
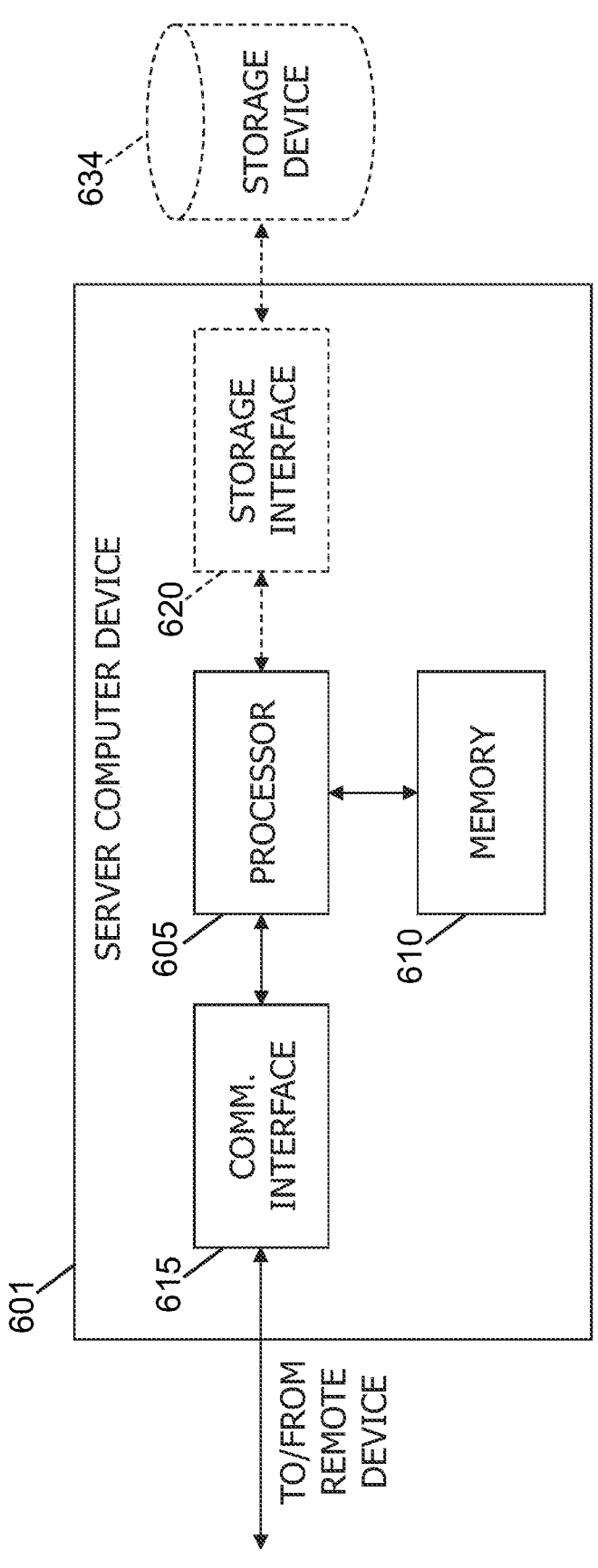
FIG. 6 illustrates an exemplary configuration of a server computer device, in accordance with one embodiment of the present disclosure.

FIG. 6 depicts an exemplary configuration 600 of a server computer device 601, in accordance with one embodiment of the present disclosure. In the exemplary embodiment, server computer device 601 may be similar to, or the same as, MTA computer system 110 (shown in FIG. 1), database server 305, and third-party server 315 (both shown in FIG. 3). Server computer device 601 may also include a processor 605 for executing instructions. Instructions may be stored in a memory area 610. Processor 605 may include one or more processing units (e.g., in a multi-core configuration).

Processor 605 may be operatively coupled to a communication interface 615 such that server computer device 601 is capable of communicating with a remote device such as another server computer device 601, MTA computer system 110, third-party servers 315, and client devices 145 (shown in FIG. 1) (for example, using wireless communication or data transmission over one or more radio links or digital communication channels). For example, communication interface 615 may audio input from client devices 145 via the Internet, as illustrated in FIG. 3.

Processor 605 may also be operatively coupled to a storage device 634. Storage device 634 may be any computer-operated hardware suitable for storing and/or retrieving data, such as, but not limited to, data associated with one or more models. In some embodiments, storage device 634 may be integrated in server computer device 601. For example, server computer device 601 may include one or more hard disk drives as storage device 634.

In other embodiments, storage device 634 may be external to server computer device 601 and may be accessed by a plurality of server computer devices 601. For example, storage device 634 may include a storage area network (SAN), a network attached storage (NAS) system, and/or multiple storage units such as hard disks and/or solid-state disks in a redundant array of inexpensive disks (RAID) configuration.

In some embodiments, processor 605 may be operatively coupled to storage device 634 via a storage interface 620. Storage interface 620 may be any component capable of providing processor 605 with access to storage device 634. Storage interface 620 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing processor 605 with access to storage device 634.

Processor 605 may execute computer-executable instructions for implementing aspects of the disclosure. In some embodiments, the processor 605 may be transformed into a special purpose microprocessor by executing computer-executable instructions or by otherwise being programmed. For example, the processor 605 may be programmed with the instruction such as illustrated in FIG. 2.

Machine Learning and Other Matters

The computer-implemented methods discussed herein may include additional, less, or alternate actions, including those discussed elsewhere herein. The methods may be implemented via one or more local or remote processors, transceivers, servers, and/or sensors (such as processors, transceivers, servers, and/or sensors mounted on vehicles or mobile devices, or associated with smart infrastructure or remote servers), and/or via computer-executable instructions stored on non-transitory computer-readable media or medium.

In some embodiments, MTA computer system 110 is configured to implement machine learning, such that MTA computer system 110 "learns" to analyze, organize, and/or process data without being explicitly programmed. Machine learning may be implemented through machine learning methods and algorithms ("ML methods and algorithms"). In an exemplary embodiment, a machine learning module ("ML module") is configured to implement ML methods and algorithms. In some embodiments, ML methods and algorithms are applied to data inputs and generate machine learning outputs ("ML outputs"). Data inputs may include but are not limited to images, text data, and/or other types of data. ML outputs may include, but are not limited to identified objects, items classifications, textual product, and/or other data extracted from the images or textual data. In some embodiments, data inputs may include certain ML outputs.

In some embodiments, at least one of a plurality of ML methods and algorithms may be applied, which may include but are not limited to: linear or logistic regression, instance-based algorithms, regularization algorithms, decision trees, Bayesian networks, cluster analysis, association rule learning, artificial neural networks, deep learning, combined learning, reinforced learning, dimensionality reduction, and support vector machines. In various embodiments, the implemented ML methods and algorithms are directed toward at least one of a plurality of categorizations of machine learning, such as supervised learning, unsupervised learning, and reinforcement learning.

In one embodiment, the ML module employs supervised learning, which involves identifying patterns in existing data to make predictions about subsequently received data. Specifically, the ML module is "trained" using training data, which includes example inputs and associated example outputs. Based upon the training data, the ML module may generate a predictive function which maps outputs to inputs and may utilize the predictive function to generate ML outputs based upon data inputs. The example inputs and example outputs of the training data may include any of the data inputs or ML outputs described above. In the exemplary embodiment, a processing element may be trained by providing it with a large sample of text with known characteristics or features. Such information may include, for example, information associated with a plurality of text of a plurality of different vendors, data sources, objects, items, and/or property.

In another embodiment, a ML module may employ unsupervised learning, which involves finding meaningful relationships in unorganized data. Unlike supervised learning, unsupervised learning does not involve user-initiated training based upon example inputs with associated outputs. Rather, in unsupervised learning, the ML module may organize unlabeled data according to a relationship determined by at least one ML method/algorithm employed by the ML module. Unorganized data may include any combination of data inputs and/or ML outputs as described above.

In yet another embodiment, a ML module may employ reinforcement learning, which involves optimizing outputs based upon feedback from a reward signal. Specifically, the ML module may receive a user-defined reward signal definition, receive a data input, utilize a decision-making model to generate a ML output based upon the data input, receive a reward signal based upon the reward signal definition and the ML output, and alter the decision-making model so as to receive a stronger reward signal for subsequently generated ML outputs. Other types of machine learning may also be employed, including deep or combined learning techniques.

In some embodiments, generative artificial intelligence (AI) models (also referred to as generative machine learning (ML) models) may be utilized with the present embodiments and may the voice bots or chatbots discussed herein may be configured to utilize artificial intelligence and/or machine learning techniques. For instance, the voice or chatbot may be a ChatGPT chatbot. The voice or chatbot may employ supervised or unsupervised machine learning techniques, which may be followed by, and/or used in conjunction with, reinforced or reinforcement learning techniques. The voice or chatbot may employ the techniques utilized for ChatGPT. The voice bot, chatbot, ChatGPT-based bot, ChatGPT bot, and/or other bots may generate audible or verbal output, text or textual output, visual or graphical output, output for use with speakers and/or display screens, and/or other types of output for user and/or other computer or bot consumption.

Based upon these analyses, the processing element may learn how to identify characteristics and patterns that may then be applied to analyzing and classifying objects. The processing element may also learn how to identify attributes of different objects in different lighting. This information may be used to determine which classification models to use and which classifications to provide.

EXEMPLARY EMBODIMENTS

In one aspect, a computer system may be provided. The computer system may include one or more local or remote processors, servers, sensors, memory units, transceivers, mobile devices, wearables, smart watches, smart glasses or contacts, augmented reality glasses, virtual reality headsets, mixed or extended reality headsets, voice bots, chat bots, ChatGPT bots, large language models (LLMs) and/or other electronic or electrical components, which may be in wired or wireless communication with one another. For instance, the computer system may include at least one processor in communication with at least one memory device. The at least one processor may be configured to: (1) analyze one or more predictive pricing sub-models to detect one or more issues with the one or more predictive pricing sub-models; (2) execute a GPT model trained to identify differences between predicted pricing and actual pricing for insurance related events, and/or identify data elements potentially related to the pricing differential including, but not limited to, claims history, vehicle history, prior insurance history, and/or public records; (3) compare the one or more issues to one or more outputs of the GPT model; (4) in response to the comparison, generate a new model software template including one or more code changes to the one or more predictive pricing sub-models based upon the comparison; (5) generate a simulation environment based upon a plurality of data; (6) execute the new model software template in the simulation environment; and/or (7) update the new model software template based upon one or more outputs of the execution. The computer system may include additional, less, or alternate functionality, including that discussed elsewhere herein.

Another embodiment of the system may include a processor configured to iteratively execute the model software template in the simulation environment and update the model software template based upon one or more outputs of the execution until one or more end conditions are met.

In a further embodiment of the system, the GPT model analyzes the one or more issues over a predetermined period of time.

In a further embodiment of the system, an issue includes a consistent variance or difference between a predicted pricing amount for an insurance event outputted from an existing predictive pricing model and an actual pricing amount for the same insurance event. In an additional embodiment of the system, an issue includes a trend exceeding one or more thresholds wherein the trend includes the consistent variance.

A further embodiment of the system may include a processor configured to communicate with one or more users via natural language processing. Another embodiment of the system may include a processor configured to transmit an action item to a user via a client device based upon the detection of the one or more issues.

A further embodiment of the system may include a processor configured to receive a prompt from a user via a client device to analyze the one or more issues in view of the GPT model. Another embodiment of the system may include a processor configured to generate a production model based upon the updated model software template. In a further embodiment of the system, the GPT model is trained for a specific jurisdiction.

In another aspect, a computer-implemented method for building, simulating, and/or validating a machine learning model may be provided. The computer-implemented method may be performed by a computer device including at least one processor in communication with at least one memory device. The method may include: (1) analyzing one or more predictive pricing sub-models to detect one or more issues with the one or more predictive pricing sub-models; (2) executing a GPT model trained to identify differences between predicted pricing and actual pricing for insurance related events, and/or identify data elements potentially related to the pricing differential including, but not limited to, claims history, vehicle history, prior insurance history, and/or public records; (3) comparing the one or more issues to one or more outputs of the GPT model; (4) in response to the comparison, generating a model software template including one or more code changes to the one or more predictive pricing sub-models based upon the comparison; (5) generating a simulation environment based upon a plurality of data; (6) executing the new model software template in the simulation environment; and/or (7) updating the new model software template based upon one or more outputs of the execution. The computer-implemented method may include additional, less, or alternate actions, including those discussed elsewhere herein.

Another embodiment of the method may include iteratively executing the model software template in the simulation environment and updating the model software template based upon one or more outputs of the execution until one or more end conditions are met.

A further embodiment of the method may include where the GPT model analyzes the one or more issues over a predetermined period of time. Another embodiment of the method may include where an issue includes a consistent variance or difference between a predicted pricing amount for an insurance event outputted from an existing predictive pricing model and an actual pricing amount for the same insurance event. In an additional embodiment of the method, an issue includes a trend exceeding one or more thresholds wherein the trend includes the consistent variance.

A further embodiment of the method may include where an issue includes a trend exceeding one or more thresholds. Another embodiment of the method may include communicating with one or more users via natural language processing.

Another embodiment of the method may include transmitting an action item to a user via a client device based upon the detection of the one or more issues. Another embodiment of the method may include receiving a prompt from a user via a client device to analyze the one or more issues in view of the GPT model.

Another embodiment of the method may include generating a production model based upon the updated model software template. Another embodiment of the method may include where the GPT model is trained for a specific jurisdiction.

In another aspect, at least one non-transitory computer-readable media having computer-executable instructions embodied thereon may be provided. When executed by a computing device including at least one processor in communication with at least one memory device, the computer-executable instructions may cause the at least one processor to: (1) analyze one or more predictive pricing sub-models to detect one or more issues with the one or more predictive pricing sub-models; (2) execute a GPT model trained to identify differences between predicted pricing and actual pricing for insurance related events, and/or identify data elements potentially related to the pricing differential including, but not limited to, claims history, vehicle history, prior insurance history, and/or public records; (3) compare the one or more issues to one or more outputs of the GPT model; (4) in response to the comparison, generate a model software template including one or more code changes to the one or more predictive pricing sub-models based upon the comparison; (5) generate a simulation environment based upon a plurality of data; (6) execute the new model software template in the simulation environment; and/or (7) update the new model software template based upon one or more outputs of the execution. The computer-executable instructions may direct additional, less, or alternate functionality, including that discussed elsewhere herein.

ADDITIONAL CONSIDERATIONS

As will be appreciated based upon the foregoing specification, the above-described embodiments of the disclosure may be implemented using computer programming or engineering techniques including computer software, firmware, hardware or any combination or subset thereof. Any such resulting program, having computer-readable code means, may be embodied or provided within one or more computer-readable media, thereby making a computer program product, i.e., an article of manufacture, according to the discussed embodiments of the disclosure. The computer-readable media may be, for example, but is not limited to, a fixed (hard) drive, diskette, optical disk, magnetic tape, semiconductor memory such as read-only memory (ROM), and/or any transmitting/receiving medium such as the Internet or other communication network or link. The article of manufacture containing the computer code may be made and/or used by executing the code directly from one medium, by copying the code from one medium to another medium, or by transmitting the code over a network.

These computer programs (also known as programs, software, software applications, "apps," or code) include machine instructions for a programmable processor and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The "machine-readable medium" and "computer-readable medium," however, do not include transitory signals. The term "machine-readable signal" refers to any signal used to provide machine instructions and/or data to a programmable processor.

As used herein, the term "database" can refer to either a body of data, a relational database management system (RDBMS), or to both. As used herein, a database can include any collection of data including hierarchical databases, relational databases, flat file databases, object-relational databases, object-oriented databases, and any other structured collection of records or data that is stored in a computer system. The above examples are example only, and thus are not intended to limit in any way the definition and/or meaning of the term database. Examples of RDBMS' include, but are not limited to including, Oracle® Database, MySQL, IBM® DB2, Microsoft® SQL Server, Sybase®, NoSQL, and PostgreSQL. However, any database can be used that enables the systems and methods described herein. (Oracle is a registered trademark of Oracle Corporation, Redwood Shores, California; IBM is a registered trademark of International Business Machines Corporation, Armonk, New York; Microsoft is a registered trademark of Microsoft Corporation, Redmond, Washington; and Sybase is a registered trademark of Sybase, Dublin, California.)

As used herein, a processor may include any programmable system including systems using micro-controllers, reduced instruction set circuits (RISC), application specific integrated circuits (ASICs), logic circuits, and any other circuit or processor capable of executing the functions described herein. The above examples are example only and are thus not intended to limit in any way the definition and/or meaning of the term "processor."

As used herein, the terms "software" and "firmware" are interchangeable and include any computer program stored in memory for execution by a processor, including RAM memory, ROM memory, EPROM memory, EEPROM memory, and non-volatile RAM (NVRAM) memory. The above memory types are example only and are thus not limiting as to the types of memory usable for storage of a computer program.

In another example, a computer program is provided, and the program is embodied on a computer-readable medium. In an example, the system is executed on a single computer system, without requiring a connection to a server computer. In a further example, the system is being run in a Windows® environment (Windows is a registered trademark of Microsoft Corporation, Redmond, Washington). In yet another example, the system is run on a mainframe environment and a UNIX® server environment (UNIX is a registered trademark of X/Open Company Limited located in Reading, Berkshire, United Kingdom). In a further example, the system is run on an iOS® environment (iOS is a registered trademark of Cisco Systems, Inc. located in San Jose, CA). In yet a further example, the system is run on a Mac OS® environment (Mac OS is a registered trademark of Apple Inc. located in Cupertino, CA). In still yet a further example, the system is run on Android® OS (Android is a registered trademark of Google, Inc. of Mountain View, CA). In another example, the system is run on Linux® OS (Linux is a registered trademark of Linus Torvalds of Boston, MA). The application is flexible and designed to run in various different environments without compromising any major functionality.

In some embodiments, the system includes multiple components distributed among a plurality of computing devices. One or more components may be in the form of computer-executable instructions embodied in a computer-readable medium. The systems and processes are not limited to the specific embodiments described herein. In addition, components of each system and each process can be practiced independent and separate from other components and processes described herein. Each component and process can also be used in combination with other assembly packages and processes.

As used herein, an element or step recited in the singular and proceeded with the word "a" or "an" should be understood as not excluding plural elements or steps, unless such exclusion is explicitly recited. Furthermore, references to "example" or "one example" of the present disclosure are not intended to be interpreted as excluding the existence of additional examples that also incorporate the recited features. Further, to the extent that terms "includes," "including," "has," "contains," and variants thereof are used herein, such terms are intended to be inclusive in a manner similar to the term "comprises" as an open transition word without precluding any additional or other elements.

Furthermore, as used herein, the term "real-time" refers to at least one of the time of occurrence of the associated events, the time of measurement and collection of predetermined data, the time to process the data, and the time of a system response to the events and the environment. In the examples described herein, these activities and events occur substantially instantaneously.

The patent claims at the end of this document are not intended to be construed under 35 U.S.C. § 112(f) unless traditional means-plus-function language is expressly recited, such as "means for" or "step for" language being expressly recited in the claim(s).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A computer system for building, simulating, and validating a predictive model, the system comprising at least one processor, and at least one memory in communication with the at least one processor, the at least one processor programmed to:

detect one or more issues with one or more predictive sub-models, the one or more predictive sub-models configured to, when executed using a trained large language model (LLM), output a predicted value associated with one or more products based on historical data;

execute a GPT model on the one or more predictive sub-models, the GPT model trained to output identified differences between the predicted value outputted by the one or more predictive sub-models and an actual value associated with the one or more products;

input the one or more detected issues and the output of the GPT model into a code LLM configured to output a new model software template including one or more computer executable instruction changes to the one or more predictive sub-models based upon a comparison of the one or more detected issues and the output of the GPT model;

generate a simulation environment based upon a plurality of record data, the plurality of record data including a plurality of historical known values associated with a plurality of products;

execute the new model software template in the simulation environment using the plurality of record data to generate one or more outputs relating to the new model software template; and update the new model software template based upon the one or more outputs of the execution to generate one or more updated predictive sub-models, the one or more updated predictive sub-models including the one or more computer executable instructions changes.

2. The computer system of claim 1, wherein the at least one processor is further programmed to iteratively execute the new model software template in the simulation environment and update the new model software template based upon one or more outputs of the execution until one or more end conditions are met.

3. The computer system of claim 1, wherein the GPT model analyzes the one or more issues with the predictive sub-model over a predetermined period of time.

4. The computer system of claim 1, wherein an issue includes a consistent variance or difference between a predicted value for replacing the one or more products outputted from an existing predictive sub-model and an actual value for replacing the one or more products.

5. The computer system of claim 1, wherein an issue includes a trend exceeding one or more thresholds, wherein the trend includes differences between different predictive sub-models and actual values.

6. The computer system of claim 1, wherein the at least one processor is further programmed to communicate with one or more users via natural language processing.

7. The computer system of claim 1, wherein the at least one processor is further programmed to transmit an action item to a user via a client device based upon the detection of the one or more issues with the one or more sub-models.

8. The computer system of claim 1, wherein the at least one processor is further programmed to:

receive a prompt from a user via a client device to analyze the one or more issues by executing the GPT model on the one or more predictive sub-models; and output from the GPT model a list of data elements identified as being related to the differences between the predicted value outputted by the one or more predictive sub-models for replacing the one or more products and actual value for replacing the one or more products.

9. The computer system of claim 1, wherein the at least one processor is further programmed to generate a production model based upon the updated model software template.

10. The computer system of claim 1, wherein the GPT model is trained for a specific jurisdiction.

11. A computer-implemented method implemented by a computer device including at least one processor in communication with at least one memory, the computer-implemented method comprising:

detecting one or more issues with one or more predictive sub-models, the one or more predictive sub-models configured to, when executed using a trained large language model (LLM), output a predicted value associated with one or more products based on historical data;

executing a GPT model on the one or more predictive sub-models, the GPT model trained to output identified differences between the predicted value outputted by the one or more predictive sub-models and an actual value associated with the one or more products;

inputting the one or more detected issues and the output of the GPT model into a code LLM configured to output a new model software template including one or more computer executable instruction changes to the one or more predictive sub-models based upon a comparison of the one or more detected issues and the output of the GPT model;

generating a simulation environment based upon a plurality of record data, the plurality of record data including a plurality of historical known values associated with a plurality of products;

executing the new model software template in the simulation environment using the plurality of record data to generate one or more outputs relating to the new model software template; and updating the new model software template based upon the one or more outputs of the execution to generate one or more updated predictive sub-models, the one or more updated predictive sub-models including the one or more computer executable instructions changes.

12. At least one non-transitory computer-readable storage media having computer-executable instructions embodied thereon, wherein when executed by at least one processor of a computer system, the computer-executable instructions cause the processor to:

detect one or more issues with one or more predictive sub-models, the one or more predictive sub-models configured to, when executed using a trained large language model (LLM), output a predicted value associated with one or more products based on historical data;

execute a GPT model on the one or more predictive sub-models, the GPT model trained to output identified differences between the predicted value outputted by the one or more predictive sub-models and an actual value associated with the one or more products;

input the one or more detected issues and the output of the GPT model into a code LLM configured to output a new model software template including one or more computer executable instruction changes to the one or more predictive sub-models based upon a comparison of the one or more detected issues and the output of the GPT model;

generate a simulation environment based upon a plurality of record data, the plurality of record data including a plurality of historical known values associated with a plurality of products;

execute the new model software template in the simulation environment using the plurality of record data to generate one or more outputs relating to the new model software template; and update the new model software template based upon the one or more outputs of the execution to generate one or more updated predictive sub-models, the one or more updated predictive sub-models including the one or more computer executable instructions changes.

13. The computer-implemented method of claim 11, further comprising iteratively executing the new model software template in the simulation environment and updating the new model software template based upon one or more outputs of the execution until one or more end conditions are met.

14. The computer-implemented method of claim 11, wherein the GPT model analyzes the one or more issues over a predetermined period of time.

15. The computer-implemented method of claim 11, wherein an issue includes a consistent variance or difference between a predicted value for replacing the one or more products outputted from an existing predictive sub-model and an actual value for replacing the one or more products.

16. The computer-implemented method of claim 11, wherein an issue includes a trend between different sub-models exceeding one or more thresholds.

17. The computer-implemented method of claim 11, further comprising communicating with one or more users via natural language processing.

18. The computer-implemented method of claim 11, further comprising transmitting an action item to a user via a client device based upon the detection of the one or more issues.

19. The computer-implemented method of claim 11, further comprising receiving a prompt from a user via a client device to analyze the one or more issues in view of the GPT model.

20. The computer-implemented method of claim 11, further comprising generating a production model based upon the updated model software template.

21. The computer system of claim 1, wherein the at least one processor is further programmed to, after generating the one or more updated predictive pricing sub-models, generate at least one predicted value using at least one of the one or more updated predictive pricing sub-models.

* * * * *